United States Patent [19]

Kusayanagi et al.

[11] Patent Number: 5,076,796
[45] Date of Patent: Dec. 31, 1991

[54] TERMINAL PIN FOR SOLDERING TO A PRINTED CIRCUIT BOARD

[75] Inventors: Jiro Kusayanagi; Shoji Yamada, both of Machida; Yuji Yamada, Yokohama, all of Japan

[73] Assignee: Molex Incorporated, Lisle, Ill.

[21] Appl. No.: 615,527

[22] Filed: Nov. 19, 1990

[51] Int. Cl.⁵ ............................................. H01R 9/09
[52] U.S. Cl. ..................................... 439/83; 439/876
[58] Field of Search ...................... 439/78, 79, 83, 876, 439/68

[56] References Cited

U.S. PATENT DOCUMENTS

| | | | |
|---|---|---|---|
| 3,864,000 | 2/1975 | Coller et al. | 439/79 X |
| 3,865,454 | 2/1975 | Blinder | 439/78 |
| 4,470,648 | 9/1984 | Davis et al. | 439/68 |
| 4,802,860 | 2/1989 | Kikuta | 439/83 X |
| 4,923,405 | 5/1990 | Munsterman et al. | 439/78 |

Primary Examiner—Neil Abrams
Assistant Examiner—Khiem Nguyen
Attorney, Agent, or Firm—Louis A. Hecht; Stephen Z. Weiss; A. A. Tirva

[57] ABSTRACT

A terminal pin is designed for insertion through a hole in a printed circuit board and for soldering to a circuit trace on the board. The pin includes a terminal portion at one end and a solder tail portion at an opposite end, with the neck portion therebetween. The neck portion has a reduced cross-sectional dimension versus that of the terminal portion and the solder tail portion to increase the flexibility of the pin at the neck portion. The neck portion provides an area of flexibility adjacent the area of soldering the pin to the printed circuit board.

15 Claims, 2 Drawing Sheets

TERMINAL PIN FOR SOLDERING TO A PRINTED CIRCUIT BOARD

FIELD OF THE INVENTION

This invention generally relates to the art of electrical connectors and, particularly, to a terminal pin for use with an electrical connector wherein the pin forms a solder tail for soldering to a printed circuit board.

BACKGROUND OF THE INVENTION

In commercial electronic product packaging, paper-base-phenolic resin boards predominantly are used in printed circuit board electronics. Circuitry, commonly in the form of circuit traces, is printed on one side of the board. Through holes are die punched through the board with no plating. Electronic components, such as connectors, are mounted on the "bare" side of the board; i.e., the side opposite the printed circuitry. Leads, usually in the form of terminal pins, project out of the connectors through the holes in the board to the circuitry side thereof for dip or wave soldering to the circuit traces. These solder connections or joints are very small and fragile.

One of the major problems with such electronics packaging is that the solder joints become damaged from cracking when the board is exposed to thermal cycling as a result of differences in thermal expansion between the board and the electronic components.

Among the components mounted to printed circuit boards, connectors are of the most prone to cause cracking primarily because of their bulky size. Since there is a finite gap between a terminal pin and the wall of a hole in the printed circuit board, and because of the high stiffness of the terminal pin, the mismatch between the thermal expansions of the paper based board and the connector result in a rocking motion with the solder joint as a pivot. Deformation is concentrated primarily at the solder joint, and the joint is extremely vulnerable to thermal cycling whereupon cracking results after repeated motion.

Cracking of solder joints is a major cause of failure in electronic packages. With popular, widely used surface mount methods, cracking of solder joints is even more disturbing because it results in complete separation of the terminal pin from the board.

One solution to the cracking problem is to strengthen the solder joint by improving the strength of the solder material. Improving the mechanical strength of the solder by alloying different constituents, however, inevitably results in a higher melting temperature than the usual eutectic solder, or increased brittleness that can make the joint even more prone to cracking. Another solution is to minimize the stress caused by the thermal mismatch between the board and the components by selecting materials with coefficients of thermal expansion close to each other. However, the use of paper-base-phenolic resin boards and plastic connector components and the conductive terminal pins has been arrived at, over time, for many considerations which do not lead to change. Still another approach would be to design the leads or terminal pins to be sufficiently compliant to absorb the expansion mismatches without accumulating stress. However, this tends to make the terminal pins too fragile during manufacturing processes and later handling. All of these considerations must be viewed in light of the fact that the connectors or other components and the board are interactive; i.e., the forces resulting from a thermal mismatch may be allocated to the board itself rather than the solder joints alone.

This invention is directed to solving the above problems and dilemmas by providing a new and improved terminal pin or lead which is designed to absorb thermal expansion mismatches in the electronic circuitry packaging without accumulating stresses in the lead.

SUMMARY OF THE INVENTION

An object, therefore, of the invention is to provide a new and improved terminal pin or lead for insertion through a hole in a printed circuit board and for soldering to a circuit trace on the board.

Generally, the terminal pin includes a terminal portion at one end of the pin, a solder tail portion at an opposite end of the pin and a neck portion therebetween. The terminal portion and the solder tail portion have substantially the same cross-sectional dimensions. The neck portion has a reduced cross-sectional dimension to increase the flexibility of the pin immediately adjacent the area of soldering the pin to the printed circuit board.

As disclosed herein, the terminal pin is generally rectangularly shaped in cross-section along substantially its entire length, with the reduced neck portion being formed by a concave area intermediate the ends of the pin.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the following description taken in conjunction with the accompanying drawings, in which like reference numerals identify like elements in the figures and in which:

DETAILED DESCRIPTION OF THE PREFERRED EMBODIMENT

Figure 1:
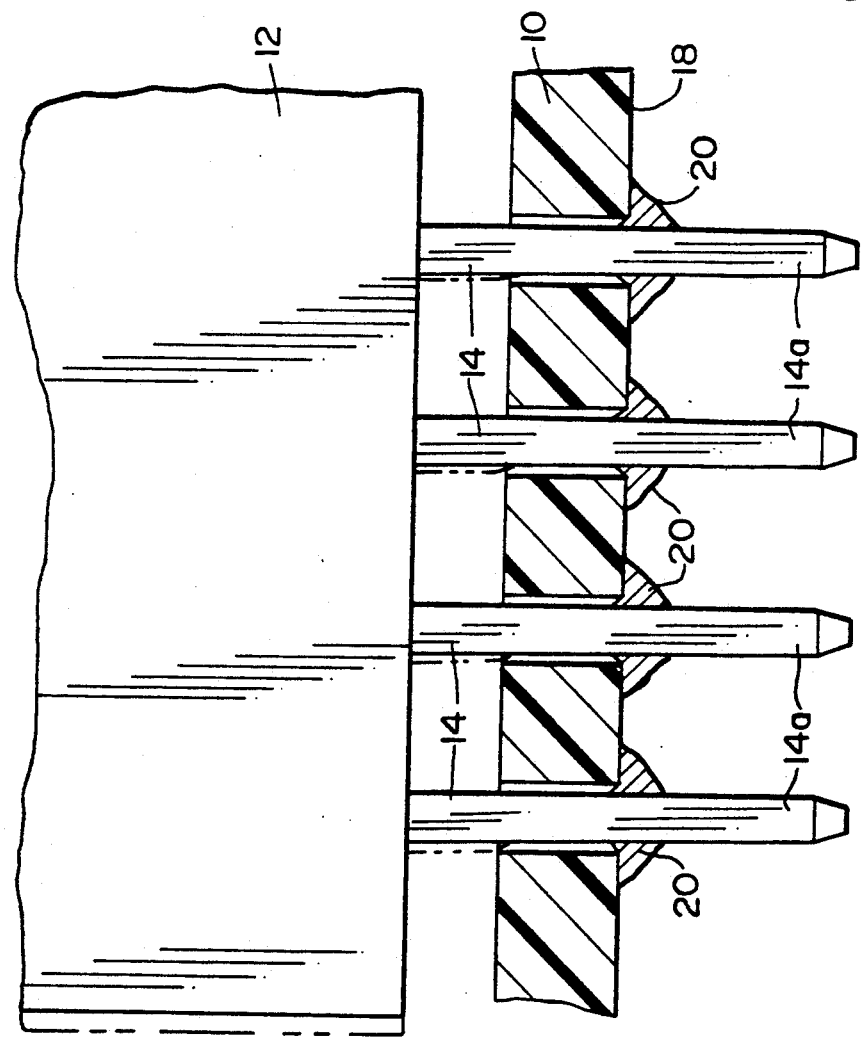
FIG. 1 is a somewhat schematic illustration of an electrical connector mounted to a printed circuit board, incorporating terminal pins of the prior art, and illustrating movement between the connector and the board as a result of thermal expansion.

Referring to the drawings in greater detail, and first to the prior art illustration of FIG. 1, a fragmented section through a printed circuit board 10 is shown in conjunction with an electronic component in the form of an electrical connector 12 mounted to the board by a plurality of terminal pins 14. Each terminal pin conventionally has a terminal portion exposed within connector 12 (not shown) for coupling to contacts of a mating connector. The pins extend through holes 16 in board 10 and each pin has a solder tail portion 14a for soldering to circuit traces on a bottom side 18 of board 10, by solder joints 20. Of course, other electronic components and other leads might be illustrated.

The illustration of FIG. 1 shows connector 12 and terminal pins 14 in full lines in a stress-free state. For the following discussion, it should be noted that only one end of the connector is shown, i.e., the left-hand end, and that the connector is elongated to the right in its entirety. With a mismatch of thermal expansion between board 10 and connector 12, the accumulating affect causes terminal pins 14 to deflect. In the illustration, the connector expands more than the board, and it can be seen by the dotted lines that the pins at opposite ends of the connector deflect the most. At some temperature, the mismatch of expansion can become large enough for the pins to actually touch the top edge of the respective hole 16 in board 10, as illustrated by the left-hand pin in FIG. 1. If the connector is sufficiently long, the end pins could reach this position even at a moderate temperature. As stated above, the stresses from this deformation largely is concentrated at solder joints 20. Cracking results after repeated motion due to thermal expansion cycling.

Figure 2:
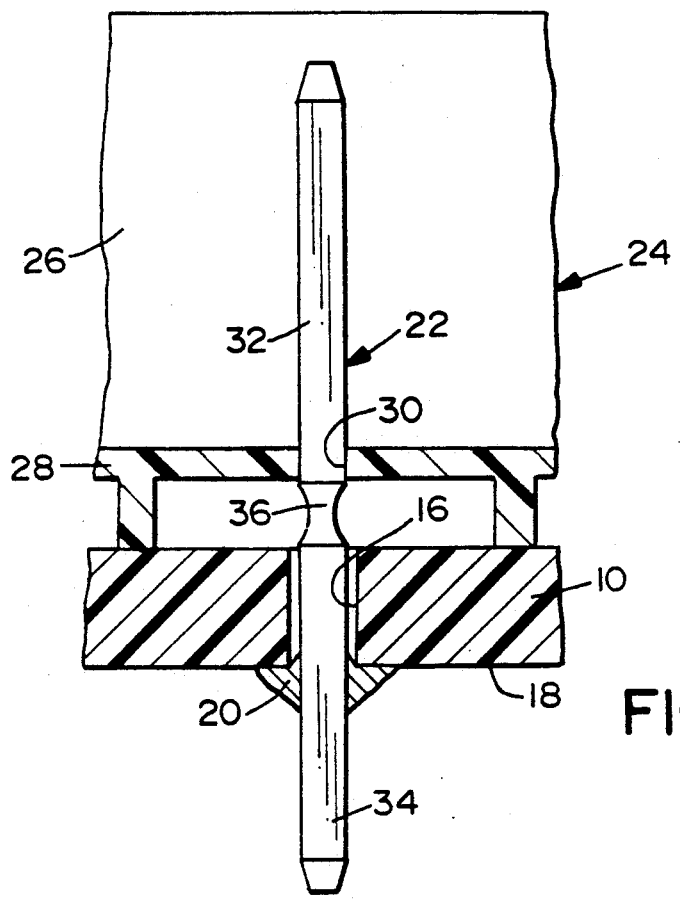
FIG. 2 is a fragmented section through a printed circuit board, illustrating a terminal pin soldered to the board and incorporating the concepts of the invention.

FIG. 2 shows a solder pin, generally designated 22, embodying the concepts of the invention. The pin may be used in conjunction with an electrical connector, generally designated 24, which includes a housing having side walls 26, a bottom wall 28 and a plurality of holes 30 in the bottom wall through which a plurality of terminal pins 22 protrude. The housing has standoffs 31 which space bottom wall 28 from printed circuit board 10.

Each terminal pin 22 has a terminal portion 32 at one end thereof exposed within an interior cavity of connector 24 defined by side walls 26 for electrically coupling to contacts of a mating connector (not shown). The pin has a solder tail portion 34 projecting through one of a plurality of the holes 16 in printed circuit board 10. As described in relation to FIG. 1, the solder tail is electrically coupled to circuit traces on bottom side 18 of the board by solder joints 20 which may be formed by dip soldering or wave soldering or other known processes.

The invention contemplates forming a neck portion 36 intermediate the ends of terminal pin 22. In the illustrated embodiment, neck portion 36 is disposed between terminal portion 32 and solder tail portion 34 of the terminal pin. Neck portion 36 has a reduced cross-sectional dimension to increase the flexibility of the pin in order to absorb the thermal mismatches described above without accumulating stresses in the pin which are transmitted to solder joint 20. In the preferred embodiment, neck portion 36 is disposed at a location along the length of the terminal pin so as to be adjacent solder joint 20 in the space between bottom wall 28 and the printed circuit board. Therefore, as connector 24 moves or shifts either to the right or to the left as viewed in FIG. 2, this motion is "absorbed" by the pin at neck portion 36. In other words, solder joint 20 no longer acts as the pivot for the pin as in the prior art described in relation to FIG. 1. The pivot now is at the neck portion and the solder joint is isolated from the stresses.

Figure 3:
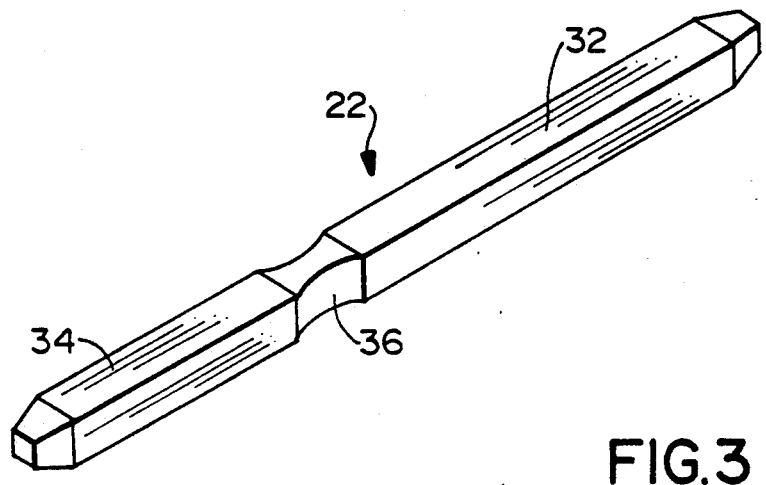
FIG. 3 is a perspective view of the terminal pin of the invention.

FIG. 3 shows a perspective view of terminal pin 22 wherein it can be seen that the entire pin is of an identical, rectangular or square configuration along its length, except for reduced neck portion 36 which is formed by concave sides of the pin. This pin configuration corresponds to the predominant configuration of terminal pins used with header-type connectors widely used in commercial electronic product packaging today. However, it should be understood that the concepts of the invention are equally applicable to other types of terminals or leads which are soldered to printed circuit boards wherein the solder joints are prone to cracking because of thermal expansion mismatches between the circuit board and the electronic components.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A terminal pin for insertion through a hole in a printed circuit board and for soldering to a circuit trace on the board, comprising a terminal portion at one end of the pin, a solder tail portion at an opposite end of the pin and a neck portion therebetween, the terminal portion of the solder tail portion having substantially the same cross-sections dimensions, and the neck portion having a reduced cross-sectional dimension forming a square in a plane perpendicular to the longitudinal axis of the pin to increase the flexibility of the pin substantially the same in all directions radial to the pin in the area of soldering to the printed circuit board.

2. The terminal pin of claim 1 wherein the terminal portion and the tail portion of the pin are rectangular in cross-section.

3. The terminal pin of claim 1 wherein said neck portion of the pin has concave sides.

4. The terminal pin of claim 3 wherein the terminal portion and the tail portion of the pin are rectangular in cross-section.

5. A terminal pin for insertion through a hole in a printed circuit board and for soldering to a circuit trace at a solder joint on one side of the board, the pin having a reduced cross-sectional portion forming a square in a plane perpendicular to the longitudinal axis of the pin located to provide a pivot area to increase the flexibility of the pin substantially the same in all directions radial to the pin at said portion and thereby isolating stresses from the solder joint.

6. The terminal pin of claim 5 wherein the pin has a generally uniform cross-section on opposite sides of the reduced cross-sectional portion.

7. The terminal pin of claim 6 wherein said reduced cross-sectional portion has concave sides.

8. The terminal pin of claim 7 wherein said generally uniform cross-section is rectangular.

9. The terminal pin of claim 6 wherein said generally uniform cross-section is rectangular.

10. A terminal pin for mounting on an electrical connector and extending therefrom for soldering to a printed circuit board at a solder joint, the pin having a reduced cross-sectional portion forming a square in a plane perpendicular to the longitudinal axis of the pin between the connector and the solder joint to increase the flexibility of the pin substantially the same in all directions radial to the pin at said portion and thereby isolating stresses from the solder joint.

11. The terminal pin of claim 10 wherein the pin has a generally uniform cross-section on opposite sides of the reduced cross-sectional portion.

12. The terminal pin of claim 11 wherein said generally uniform cross-section is rectangular.

13. The terminal pin of claim 11 wherein said reduced cross-sectional portion has concave sides.

14. The terminal pin of claim 13 wherein said generally uniform cross-section is rectangular.

15. The terminal pin of claim 10 wherein said connector has a bottom wall through which the terminal pin extends, the bottom wall being spaced from the printed circuit board, and said reduced cross-sectional portion of the terminal pin being located in the space between the bottom wall and the board.

* * * * *